United States Patent
Konishi et al.

(10) Patent No.: US 9,726,357 B2
(45) Date of Patent: Aug. 8, 2017

(54) LIGHT-EMITTING DEVICE

(71) Applicant: Sharp Kabushiki Kaisha, Osaka-shi, Osaka (JP)

(72) Inventors: Masahiro Konishi, Osaka (JP); Yuhsuke Fujita, Osaka (JP); Ippei Yamaguchi, Osaka (JP); Takashi Nakanishi, Osaka (JP); Hiroyuki Nokubo, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 86 days.

(21) Appl. No.: 14/761,981

(22) PCT Filed: Jan. 20, 2014

(86) PCT No.: PCT/JP2014/050995
§ 371 (c)(1),
(2) Date: Jul. 20, 2015

(87) PCT Pub. No.: WO2014/122971
PCT Pub. Date: Aug. 14, 2014

(65) Prior Publication Data
US 2015/0316242 A1    Nov. 5, 2015

(30) Foreign Application Priority Data
Feb. 6, 2013 (JP) .................................. 2013-021520

(51) Int. Cl.
*H01L 21/44* (2006.01)
*H01L 23/532* (2006.01)
(Continued)

(52) U.S. Cl.
CPC .............. *F21V 23/002* (2013.01); *F21K 9/00* (2013.01); *H05K 3/246* (2013.01); *H05K 3/247* (2013.01);
(Continued)

(58) Field of Classification Search
CPC . H01L 2224/45144; H01L 2224/48091; H01L 2924/00; H01L 2924/00014;
(Continued)

(56) References Cited

U.S. PATENT DOCUMENTS 5,994,212 A * 11/1999 Arakawa ............. H01L 21/4825
257/666
6,306,685 B1 * 10/2001 Liu ..................... H01L 21/4832
257/E23.124
(Continued)

FOREIGN PATENT DOCUMENTS

JP    11-126853 A    5/1999
JP    2011-517125 A    5/2011
(Continued)

OTHER PUBLICATIONS

Official Communication issued in International Patent Application No. PCT/JP2014/050995, mailed on Feb. 10, 2014.

*Primary Examiner* — Peggy Neils
(74) *Attorney, Agent, or Firm* — Keating & Bennett, LLP

(57) ABSTRACT

In a light-emitting device (30), a wiring pattern including conductor wirings (160, 165) and electrodes (170, 180) is formed on a substrate (110), and an Au layer (120) is formed on the wiring pattern.

10 Claims, 5 Drawing Sheets

(51) Int. Cl.
- *F21V 23/00* (2015.01)
- *F21K 9/00* (2016.01)
- *H05K 3/24* (2006.01)
- *H01L 33/62* (2010.01)
- *H05K 1/05* (2006.01)
- *F21Y 115/10* (2016.01)

(52) U.S. Cl.
CPC .......... *F21Y 2115/10* (2016.08); *H01L 33/62* (2013.01); *H01L 2224/45144* (2013.01); *H01L 2224/48091* (2013.01); *H01L 2224/48137* (2013.01); *H05K 1/053* (2013.01); *H05K 2201/0341* (2013.01); *H05K 2201/10106* (2013.01); *H05K 2201/10409* (2013.01)

(58) Field of Classification Search
CPC ... H01L 2924/2224; H01L 2924/48137; H01L 33/62; F21K 9/00; F21V 23/002; H05K 1/053; H05K 2201/0341; H05K 3/246; H05K 3/247; F21Y 2115/10
See application file for complete search history.

(56) References Cited

U.S. PATENT DOCUMENTS

| | | | |
|---|---|---|---|
| 7,671,373 B2* | 3/2010 | Wang | H01L 25/0753 257/100 |
| 9,451,693 B2* | 9/2016 | Das | H05K 1/0313 |
| 2009/0026634 A1* | 1/2009 | Sakurai | H01L 24/10 257/778 |
| 2009/0151982 A1* | 6/2009 | Oshika | H01L 23/142 174/126.2 |
| 2011/0074000 A1 | 3/2011 | Jaeger et al. | |
| 2011/0180817 A1 | 7/2011 | Ishizaki et al. | |
| 2011/0241043 A1* | 10/2011 | Nakayama | H01L 33/60 257/98 |
| 2014/0042900 A1 | 2/2014 | Hotta et al. | |

FOREIGN PATENT DOCUMENTS

| | | |
|---|---|---|
| JP | 2011-151268 A | 8/2011 |
| JP | 2012-109529 A | 6/2012 |
| JP | 2012-209425 A | 10/2012 |
| WO | 2012/133173 A1 | 10/2012 |

* cited by examiner

F I G. 2
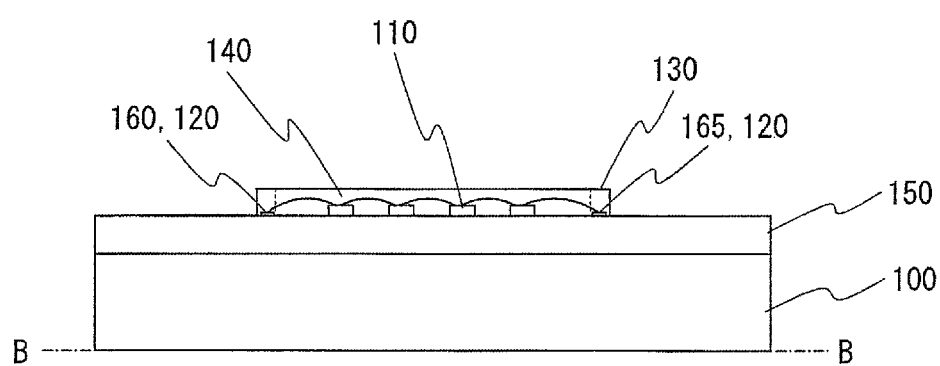

LIGHT-EMITTING DEVICE

TECHNICAL FIELD

The present invention relates to a light-emitting device including light emitting elements which are formed on a substrate. In addition, the present invention relates to a method for manufacturing such a light-emitting device.

BACKGROUND ART

In the related art, as light-emitting devices including light emitting elements which are formed on a substrate, a light-emitting device using a ceramic substrate, a light-emitting device including an organic resist layer as an insulating layer on a metal substrate and the like have been known.

As an example of the ceramic substrate, PTL 1 discloses a ceramic substrate in which a wiring is formed on the substrate by sintering silver-based conductor paste.

CITATION LIST

Patent Literature

PTL 1: Japanese Unexamined Patent Application Publication No. 11-126853 (published on May 11, 1999)

SUMMARY OF INVENTION

Technical Problem

However, the silver-based conductor paste is oxidized and easily turns black, and thus, the wiring may be easily deteriorated with the configuration of the related art.

The invention is made in consideration of these circumstances and an object thereof is to realize a light-emitting device in which deterioration of a wiring due to oxidization hardly occurs. Another object of the invention is to realize a method for manufacturing such a light-emitting device.

Solution to Problem

A light-emitting device according to an aspect of the invention including a substrate and light emitting elements disposed on the substrate, in which a wiring pattern electrically connected to the light emitting elements is formed on the substrate, and a gold layer is formed on the wiring pattern.

A method for manufacturing a light-emitting device according to an aspect of the invention including a step of forming a wiring pattern on a ceramic substrate, and a step of forming a gold layer on the wiring pattern.

Advantageous Effects of Invention

According to an aspect of the invention, it is possible to realize a light-emitting device in which deterioration of a wiring due to oxidization hardly occurs.

BRIEF DESCRIPTION OF DRAWINGS

FIG. 2 is a sectional view of the light-emitting device according to the embodiment 1 of the invention which is separate from FIG. 1.

DESCRIPTION OF EMBODIMENTS

Embodiment 1

One embodiment of the invention will be described.

Figure 1:
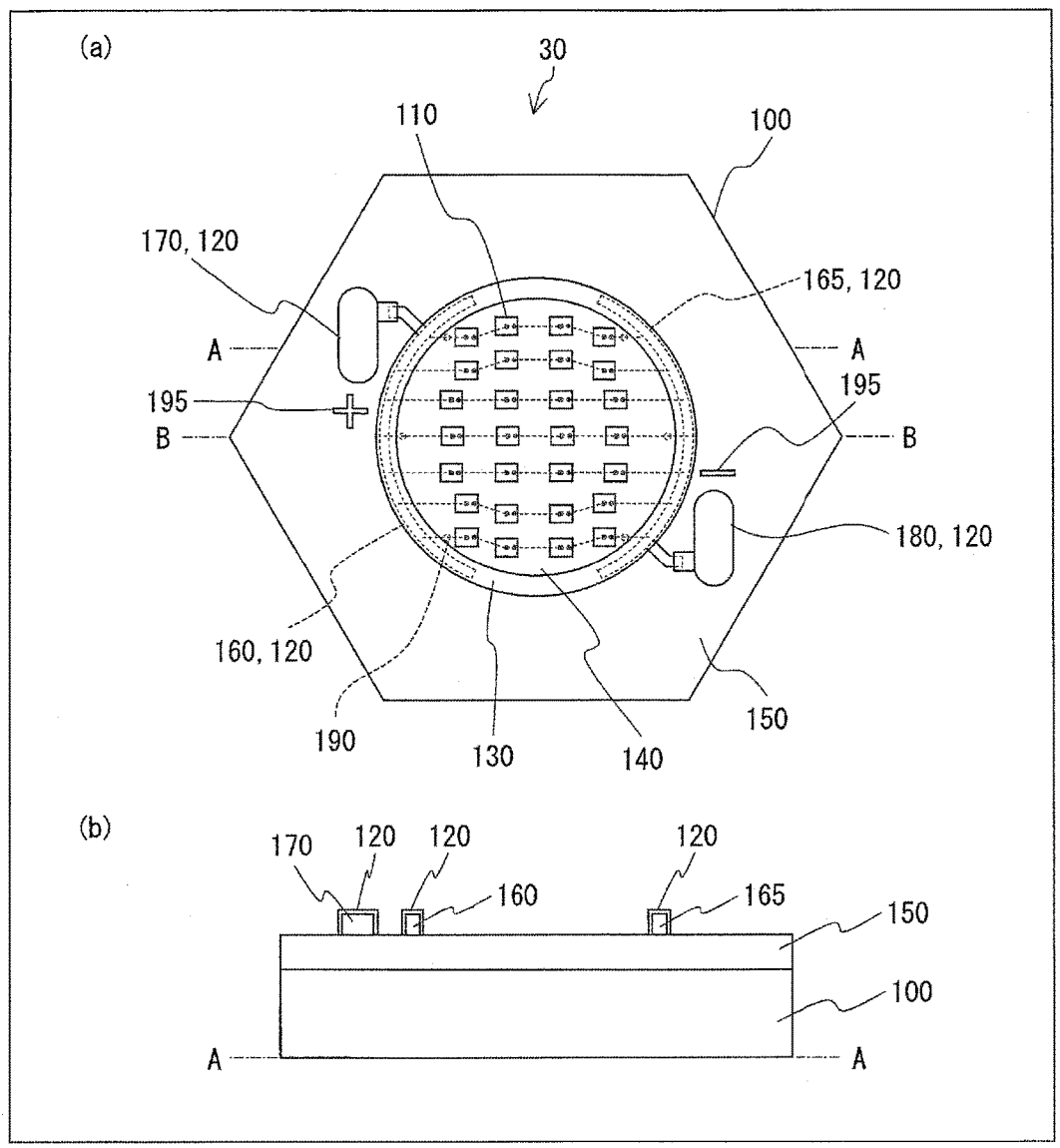
FIG. 1 includes a top view and a sectional view of a light-emitting device according to embodiment 1 of the invention.

Part (a) of FIG. 1 is a top view showing a configuration example of a light-emitting device 30 according to the embodiment and part (b) of FIG. 1 is a sectional view taken along A-A line shown in the part (a) of FIG. 1. In addition, FIG. 2 is a sectional view taken along B-B line shown in the part (a) of FIG. 1.

As shown in FIG. 1, the light-emitting device 30 includes a substrate 100, light emitting elements (semiconductor light emitting elements) 110, a light reflection resin frame 130, a sealing resin 140, and a ceramic insulating film 150 having a single-layered structure.

The substrate 100 is an aluminum substrate. A material of the substrate is not particularly limited, but for example, it is desired to use a substrate formed of metal having high thermal conductivity, such as aluminum or copper. The thermal conductivity of the metal substrate is preferably equal to or greater than 200 [W/m·k] and the thermal conductivity of the aluminum substrate is 230 [W/m·k]. In addition, when copper (thermal conductivity: 398 [W/m·k]) is used as the material of the metal substrate 100, the thermal conductivity of the metal substrate 100 is 398 [W/m·k]. The substrate may be a ceramic substrate. That is, in the embodiment, an example of the ceramic substrate containing a metal plate and a ceramic insulating film is shown, but a simple ceramic substrate may be used.

In the embodiment, the aluminum substrate 100 was used due to its low cost, ease of processing, and high resistance to atmospheric humidity. In the embodiment, an external shape of the substrate 100 in a substrate surface direction is a hexagon, but the external shape of the substrate 100 is not limited thereto, and an arbitrary shape of a closed figure may be used. The shape of the closed figure may have a periphery of the closed figure which is configured with only straight lines or only curved lines, or the shape of the closed figure may have a periphery of the closed figure which includes at least one linear part and at least one curved part. The shape of the closed figure is not limited to a projecting shape and may be a recessed shape. For example, as an example of a projecting polygonal shape configured with only straight lines, a triangle, a square, a pentagon, or an octagon may be used, and an arbitrary recessed polygonal shape may be used. In addition, as an example of a shape of a closed figure configured with only curved lines, a circle or an ellipse may be used or a shape of a closed figure such as a projecting curved shape or a recessed curved shape may be used. Further, as an example of a shape of a closed figure including at least one linear part and at least one curved part, a racetrack shape may be used.

The ceramic insulating film 150 is a film which is formed on one surface (hereinafter, referred to as a surface) of the substrate 100 by a printing method and has electrical insulation, a high light reflecting property, and high thermal conductivity. The method for forming the ceramic insulating film 150 is not limited to the printing method, and a method for applying ceramic paint to the substrate 100 using a spray is also used. Accordingly, heat generated by the light emitting element 110 can be released to the metal substrate through the insulating film. Therefore, it is possible to realize high thermal conductivity. In addition, it is possible to reflect light leaked from the light emitting element 110 in the substrate surface direction of the metal substrate by the insulating layer. Therefore, it is possible to realize high thermal conductivity and a high light reflecting property. In addition, when aluminum having a low melting point is used as the metal substrate, it is possible to maintain the shape of the metal substrate and to sinter the ceramic to the surface of the metal substrate, by using a zirconia-based ceramic which is sintered at a sintering temperature which is lower than the melting point of aluminum.

The light emitting element 110, the light reflection resin frame 130, and the sealing resin 140 are provided on the surface of the ceramic insulating film 150. In addition, a wiring pattern including an anode conductor wiring 160, a cathode conductor wiring 165, and an anode electrode 170 and a cathode electrode 180 as land portions, is formed on the surface of the ceramic insulating film 150, and an alignment mark 190 and a polarity mark 195 are directly formed thereon.

The wiring pattern includes a silver layer and a nickel layer and the nickel layer is formed on the silver layer. The silver layer is formed on the substrate 100 (surface of the ceramic insulating film 150). An Au layer (gold layer) 120 is formed on the wiring pattern. The wiring pattern may be formed by forming a silver nanoparticle paste layer on the silver layer and forming the nickel layer on the silver nanoparticle paste layer. Alternatively, the wiring pattern may be formed by forming the nickel layer on the silver layer and forming a palladium layer on the nickel layer. In addition, the wiring pattern may include a base metal layer such as a base nickel layer or base metal layer, as the base of the gold layer 120.

A protection element (not shown) which is parallel-connected to a circuit in which the plurality of light emitting elements 110 are connected in series, may be further formed on the surface of the ceramic insulating film 150, as a resistance element for protecting the light emitting elements 110 from electrostatic withstanding voltage. The protection element can be, for example, formed by a printed resistor or a zener diode. When using the zener diode as the protection element, the zener diode is die-bonded onto the wiring pattern and is electrically connected to a desired wiring by wire bonding. In this case, the zener diode is also parallel-connected to a circuit in which the plurality of light emitting elements 110 are connected in series.

The light emitting element 110 is a semiconductor light emitting element such as a light emitting diode (LED), and in the embodiment, a blue light emitting element having an emission peak wavelength of approximately 450 nm is used. However, the configuration of the light emitting element 110 is not limited thereto, and for example, an ultraviolet (near ultraviolet) light emitting element having an emission peak wavelength of 390 nm to 420 nm may be used. By using the ultraviolet (near ultraviolet) light emitting element described above, it is possible to further improve light emission efficiency.

The plurality of (20 in the embodiment) light emitting elements 110 are mounted on predetermined locations of the surface of the ceramic insulating film 150 where a predetermined amount of light emission is satisfied. The electric connection of the light emitting elements 110 (the anode conductor wiring 160 and the cathode conductor wiring 165) is performed by wire bonding using a wire. A gold wire can be used, for example, as the wire.

As the light reflection resin frame 130, the circular (arc) light reflection resin frame 130 formed of an alumina filler-containing silicone resin is formed. However, the material of the light reflection resin frame 130 is not limited thereto, and an insulating resin having a light reflecting property may be used. The shape of the light reflection resin frame 130 is not limited to the circular (arc) shape, and an arbitrary shape can be used. The same applies to the shape of the anode conductor wiring 160, the cathode conductor wiring 165, and the protection element.

The sealing resin 140 is a sealing resin layer formed of a transparent resin, and as shown in FIG. 2, the sealing resin is formed by being filled in an area surrounded by the light reflection resin frame 130 and seals the ceramic insulating film 150, the light emitting element 110 and the wire, and the like.

A phosphor may be contained in the sealing resin 140. As the phosphor, a phosphor which is excited by primary light emitted from the light emitting element 110 and emits light having a longer wavelength than that of the primary light may be used. The configuration of the phosphor is not particularly limited, and can be suitably selected depending on desired white chromaticity. As a combination of daylight color and bulb light color, a combination of a YAG yellow phosphor and a (Sr, Ca) $AlSiN_3$:Eu red phosphor or a combination of a YAG yellow phosphor and a $CaAlSiN_3$:Eu red phosphor can be used. As a combination for high color rendering, a combination of a (Sr, Ca) $AlSiN_3$:Eu red phosphor and a $Ca_3(Sc,Mg)_2Si_3O_{12}$:Ce green phosphor can be used. Other combinations of phosphors may be used or a configuration of including only the YAG yellow phosphor as pseudo white may be used.

As described above, in the light-emitting device 30 according to the embodiment, the Au layer 120 is formed on the wiring pattern including the anode conductor wiring 160, the cathode conductor wiring 165, the anode electrode 170, and the cathode electrode 180 as land portions. In addition, in the light-emitting device 30 according to the embodiment, the light emitting elements 110, the electrode portions (the anode electrode 170 and the cathode electrode 180) for connecting the light-emitting device 30 to an external wiring (or external device), the wirings (the anode conductor wiring 160 and the cathode conductor wiring 165) for connecting the light emitting elements 110 and each electrode portion (the anode electrode 170 and the cathode electrode 180) to each other, the frame portion (light reflection resin frame 130) formed of resin having a light reflection property which is formed so as to surround the area where the light emitting elements 110 are disposed, and the sealing resin 140 which seals the members (a part of the ceramic insulating film 150, the light emitting elements 110 and the wire, and the like) disposed in the area surrounded by the frame (light reflection resin frame 130) are directly formed on the surface of the ceramic insulating film 150.

(Manufacturing Method of Light-Emitting Device 30)

Next, a manufacturing method of the light-emitting device 30 will be described.

First, the ceramic insulating film 150 having a thickness of 100 μm is formed on one surface of the aluminum substrate 100 by a printing method. Specifically, after printing (film thickness equal to or greater than 20 μm) the ceramic paint on one surface of the substrate 100, the ceramic insulating film 150 is formed through a drying step and a sintering step. As the ceramic paint, paint having electrical insulation, high thermal conductivity, and a high light reflecting property after the sintering step is preferably used. In addition, a solidifying agent for attaching the ceramic paint to the substrate 100, a resin for easily performing printing, and a solution for maintaining viscosity are contained in the ceramic paint.

Next, the anode conductor wiring 160, the cathode conductor wiring 165, and the anode electrode 170 and the cathode electrode 180 as land portions, the alignment mark 190, and the polarity mark 195 are formed on the ceramic insulating film 150 by a screen printing method. In the embodiment, the wiring pattern including the anode conductor wiring 160, the cathode conductor wiring 165, and the anode electrode 170 and the cathode electrode 180 as land portions is formed as follows. First, silver resin paste printing is executed. Then, an electroless plating process is executed on the silver resin paste and a nickel layer is formed. By doing so, the wiring pattern described above is formed.

The wiring pattern described above may be formed by forming the silver nanoparticle paste layer on the silver layer and forming the nickel layer on the silver resin paste layer, after forming the silver layer on the substrate 100. Alternatively, the wiring pattern described above may be formed by forming the nickel layer on the silver layer and forming the palladium layer on the nickel layer, after forming the silver layer on the substrate 100. In any case, instead of directly forming the silver layer on the substrate 100 (surface of the ceramic insulating film 150), the gold layer may be formed on the base metal layer, after forming the base metal layer such as a base nickel layer or base metal on the substrate, as a base of the gold layer.

Then, the Au layer 120 is formed on the wiring pattern by electroless plating. Accordingly, it is possible to prevent oxidization of the silver wiring of the wiring pattern. In order to obtain the same effect, a Pd/Au layer (a two-layered film formed of a palladium layer and a gold layer) may be formed on the wiring pattern. Then, the plurality of light emitting elements 110 are fixed onto the ceramic insulating film 150 using resin paste. In addition, each light emitting element 110 is connected with a wire and the conductor wirings 160 and 165 and the light emitting elements 110 are wire-bonded for electric connection.

Next, the light reflection resin frame 130 is formed on the substrate 100, the anode conductor wiring 160 and the cathode conductor wiring 165 so as to surround the periphery of the mounting area of the light emitting elements 110. A method for forming the light reflection resin frame 130 is not particularly limited, and a well-known method of the related art can be used.

After that, the area surrounded by the light reflection resin frame 130 is filled with the sealing resin 140 and the sealing resin seals the ceramic insulating film 150, the light emitting elements 110 and the wire, and the like in the area described above.

Reflectivity of the ceramic insulating film 150 formed in the embodiment (reflectivity of light having a wavelength of 450 nm) is higher than reflectivity of the aluminum substrate 100 by approximately 4%.

In addition, in the embodiment, a thickness of the ceramic insulating film 150 was determined based on the reflectivity and dielectric strength voltage. When the ceramic insulating film 150 has an excessively great thickness, cracks may be generated, and when the ceramic insulating film 150 has an excessively small thickness, sufficient reflectivity and dielectric strength voltage may not be obtained. Accordingly, the thickness of the ceramic insulating film 150 formed on the substrate 100 is preferably from 20 µm to 130 and more preferably from 50 µm to 100 µm, in order to ensure the reflectivity of a visible area and the insulating property of the light emitting elements 110 and the substrate 100 and to prevent generation of cracks.

Embodiment 2

Another embodiment of the invention will be described. For convenience of description, the same reference numerals are used for the members having the same functions as those of the members described in the embodiment 1, and the description thereof will be omitted.

In the embodiment 1, the ceramic insulating film 150 having a single-layered structure was formed on the substrate 100. With respect to this, in the embodiment, the ceramic insulating film 150 having a multi-layered structure formed of a plurality of ceramic layers is formed on the substrate 100.

In the embodiment 1, the Au layer was formed directly on the wiring pattern including the silver layer and the nickel layer. With respect to this, in the embodiment, the Au layer is formed directly on the wiring pattern including the silver layer, the silver nanoparticle paste layer, and the nickel layer.

Figure 3:
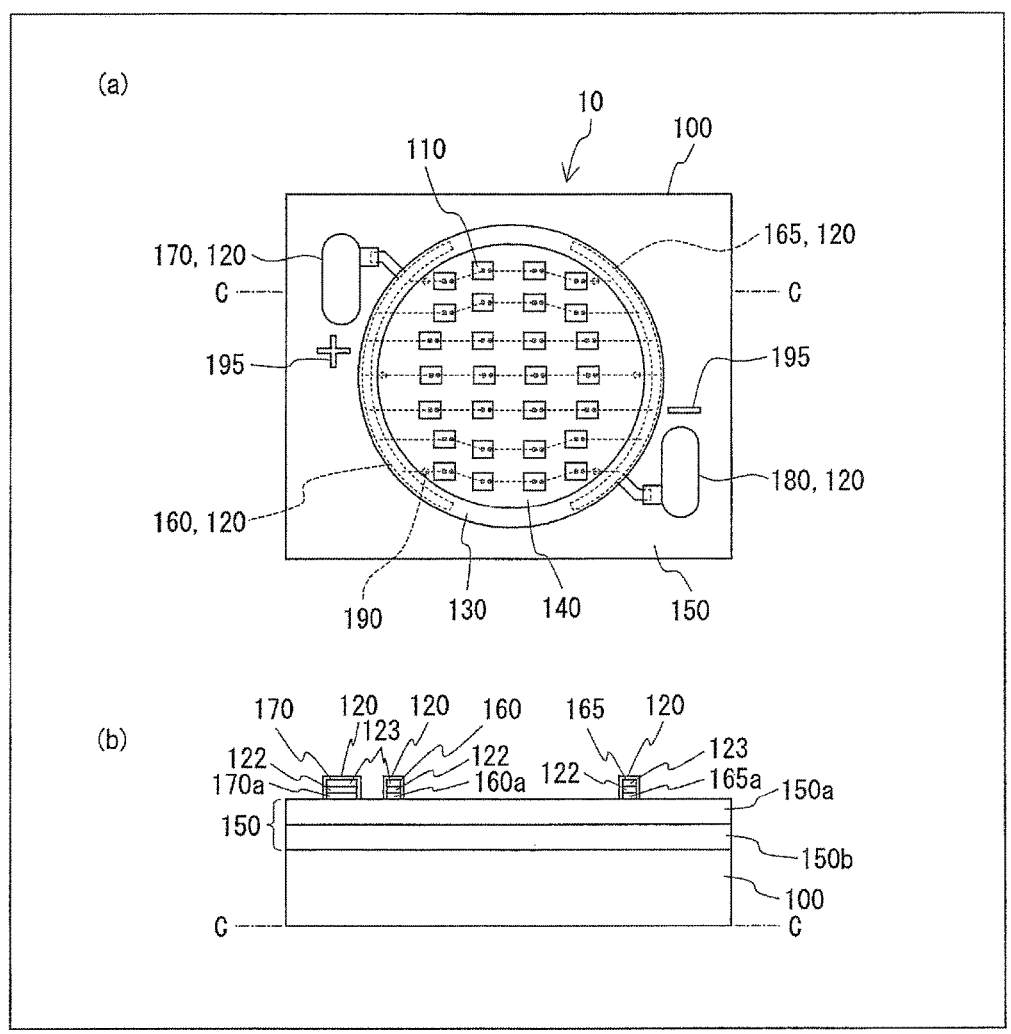
FIG. 3 includes a top view and a sectional view of a light-emitting device according to embodiment 2 of the invention.

Part (a) of FIG. 3 is a top view showing a configuration example of a light-emitting device 10 according to the embodiment and part (b) of FIG. 3 is a sectional view taken along C-C line shown in the part (a) of FIG. 3.

As shown in FIG. 3, the light-emitting device 10 includes the substrate 100, the light emitting elements (semiconductor light emitting elements) 110, the light reflection resin frame 130, the sealing resin 140, and the ceramic insulating film 150 having a multi-layered structure.

The light-emitting device 10 is different from the light-emitting device 30 of the embodiment 1 in that (i) the ceramic insulating film 150 is formed of a multi-layered structure including a ceramic layer (first ceramic layer) 150b having high thermal conductivity and a ceramic layer (second ceramic layer) 150a having a high light reflection property, (ii) the external shape of the substrate 100 is a square, and (iii) the wiring pattern including the silver nanoparticle paste between the silver layer and the nickel layer is formed, but the other points are substantially the same.

The substrate 100 is a substrate formed of a material having high thermal conductivity. The material of the substrate 100 is not particularly limited, and a substrate formed of metal such as aluminum or copper can be used, for example. In the embodiment, aluminum substrate was used, in the same manner as in the embodiment 1.

The ceramic insulating film 150 is a film having a multi-layered structure in which the high thermal conductivity ceramic layer 150b and the high light reflection ceramic layer 150a are laminated on the substrate 100. In the embodiment, the ceramic insulating film 150 having high thermal conductivity and a high light reflection property is formed by having the multi-layered structure by laminating two different ceramic layers described above. Regarding the high thermal conductivity ceramic layer 150b and the high light reflection ceramic layer 150a, the high thermal conductivity ceramic layer 150b is preferably formed on the substrate 100 and the high light reflection ceramic layer 150a is preferably formed thereon. At least one of the high thermal conductivity ceramic layer 150b and the high light reflection ceramic layer 150a preferably has electric insulation.

The light emitting element 110, the light reflection resin frame 130, and the sealing resin 140 are provided on the surface of the ceramic insulating film 150. In addition, the wiring pattern including the anode conductor wiring 160, the cathode conductor wiring 165, and the anode electrode 170 and the cathode electrode 180 as land portions, is formed on the surface of the ceramic insulating film 150, and the alignment mark 190 and the polarity mark 195 are directly formed thereon. As the wiring pattern, a silver layer is formed, a layer of silver nanoparticle paste containing nano-size silver particles is formed on the silver layer, and a nickel layer is formed on the layer of silver nanoparticle paste by the electroless plating. The Au layer (gold layer) 120 is formed on the nickel layer which is a surface layer of the wiring pattern by the electroless plating.

A protection element (not shown) which is parallel-connected to a circuit in which the plurality of light emitting elements 110 are connected in series, may be further formed on the surface of the ceramic insulating film 150, as a resistance element for protecting the light emitting elements 110 from electrostatic discharge. The protection element can be, for example, formed by a printed resistor or zener diode. When using the zener diode as the protection element, the zener diode is die-bonded onto the wiring pattern and is electrically connected to a desired wiring by wire bonding. In this case, the zener diode is also parallel-connected to a circuit in which the plurality of light emitting elements 110 are connected in series.

The light emitting element 110 is a semiconductor light emitting element such as a light emitting diode (LED), and in the embodiment, a blue light emitting element having an emission peak wavelength of approximately 450 nm is used. However, the configuration of the light emitting element 110 is not limited thereto, and for example, an ultraviolet (near ultraviolet) light emitting element having an emission peak wavelength of 390 nm to 420 nm may be used. By using the ultraviolet (near ultraviolet) light emitting element described above, it is possible to further improve light emission efficiency.

The plurality of (20 in the embodiment) light emitting elements 110 are mounted on predetermined locations of the surface of the high light reflection ceramic insulating film 150a where a predetermined amount of light emission is satisfied. The electric connection of the light emitting elements 110 (the anode conductor wiring 160 and the cathode conductor wiring 165, and the like) is performed by wire bonding using a wire. A gold wire can be used, for example, as the wire.

As the light reflection resin frame 130, the circular (arc) light reflection resin frame 130 formed of an alumina filler-containing silicone resin is formed. However, the material of the light reflection resin frame 130 is not limited thereto, and an insulating resin having a light reflecting property may be used. The shape of the light reflection resin frame 130 is not limited to the circular (arc) shape, and an arbitrary shape can be used. The same applies to the shape of the anode conductor wiring 160, the cathode conductor wiring 165, and the protection element.

The sealing resin 140 is a sealing resin layer formed of a transparent resin, and the sealing resin is formed by being filled in an area surrounded by the light reflection resin frame 130 and seals the ceramic insulating film 150, the light emitting element 110 and the wire, and the like.

A phosphor may be contained in the sealing resin 140. As the phosphor, a phosphor which is excited by primary light emitted from the light emitting element 110 and emits light having a longer wavelength than that of the primary light may be used. The configuration of the phosphor is not particularly limited, and can be suitably selected depending on desired white chromaticity. As a combination of daylight color and bulb light color, a combination of a YAG yellow phosphor and a (Sr, Ca) AlSiN$_3$:Eu red phosphor or a combination of a YAG yellow phosphor and a CaAlSiN$_3$:Eu red phosphor can be used. As a combination for high color rendering, a combination of a (Sr, Ca) AlSiN$_3$:Eu red phosphor and a Ca$_3$(Sc,Mg)$_2$Si$_3$O$_{12}$:Ce green phosphor can be used. Other combinations of phosphors may be used or a configuration of including only the YAG yellow phosphor as pseudo white may be used.

(Method for Manufacturing Light-Emitting Device 10)

Figure 4:
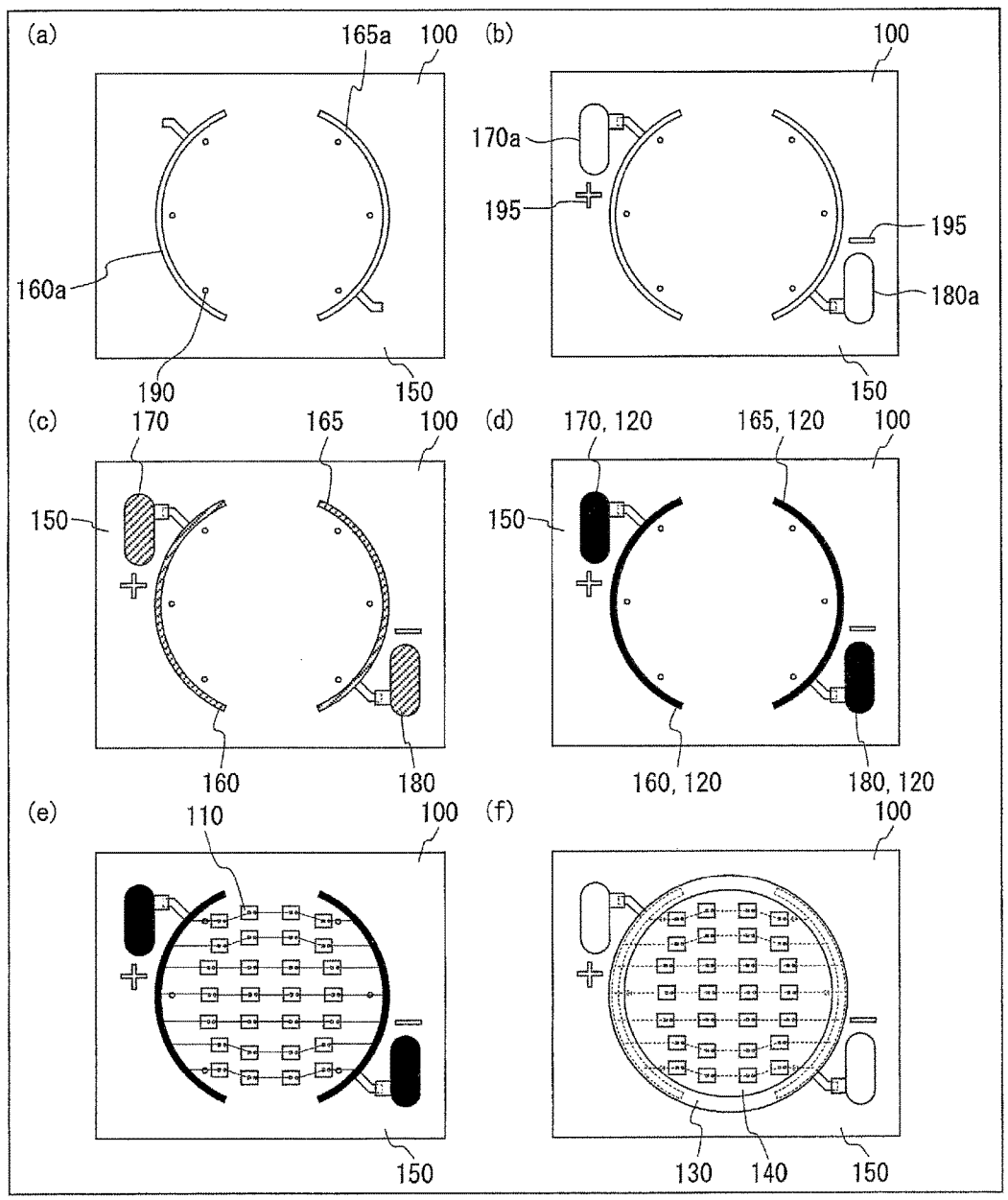
FIG. 4 is an explanatory diagram showing a manufacturing process of the light-emitting device according to the embodiment 2 of the invention.

A method for manufacturing the light-emitting device 10 will be described. FIG. 4 is an explanatory diagram showing a manufacturing process of the light-emitting device 10.

First, the high thermal conductivity ceramic layer 150b having a thickness of 50 μnm is formed on one surface of the aluminum substrate 100 by a printing method. Specifically, after printing (film thickness equal to or greater than 20 μm) the ceramic paint to be the high thermal conductivity ceramic layer 150b on one surface of the substrate 100, the high thermal conductivity ceramic layer 150b is formed through a drying step and a sintering step. As the ceramic paint, paint showing high thermal conductivity after the sintering step is used. In addition, a solidifying agent for attaching the ceramic paint to the substrate 100, a resin for easily performing printing, and a solution for maintaining viscosity are contained in the ceramic paint. The high thermal conductivity ceramic layer 150b may be formed on one surface of the substrate 100 by applying ceramic spray onto the surface.

Next, the high light reflection ceramic layer 150a having a thickness of 50 μm is formed on the high thermal conductivity ceramic layer 150b by a printing method. Specifically, after printing (film thickness equal to or greater than 20 μm) the ceramic paint to be the high light reflection ceramic layer 150a on the high thermal conductivity ceramic layer 150b, the high light reflection ceramic layer is formed through a drying step and a sintering step. As the ceramic paint, paint showing a high light reflection property after the sintering step is used. In addition, a solidifying agent for attaching the ceramic paint to the substrate 100, a resin for easily performing printing, and a solution for maintaining viscosity are contained in the ceramic paint. The high light reflection ceramic layer 150a may be formed on the high thermal conductivity ceramic layer 150b by applying ceramic spray onto the high thermal conductivity ceramic layer 150b.

The silver layer portions (160a and 165a) of the anode conductor wiring 160 and the cathode conductor wiring 165, and the alignment mark 190 are formed on the ceramic insulating film 150 (high light reflection ceramic layer 150a) by a silver resin paste printing (see part (a) of FIG. 4). After that, the silver layer portions (170a and 180a) of the anode electrode 170 and the cathode electrode 180 as land portions, and the polarity mark 195 are formed by a silver resin paste printing (see part (b) of FIG. 4).

Next, a silver nanoparticle paste layer 122 containing nano-sized silver particles is formed on each of the silver resin paste 160a, the silver resin paste 165a, the silver resin paste 170a, and the silver resin paste 180a, and a nickel layer 123 is formed on each silver nanoparticle paste layer 122. Accordingly, the anode conductor wiring 160, the cathode conductor wiring 165, the anode electrode 170 and the cathode electrode 180 are formed (see part (c) of FIG. 4). In this case, the layers configuring the wiring pattern are silver layer/silver nanoparticle paste layer/nickel layer in the order from the lower layer, and a palladium layer may be formed on the nickel layer. In this case, the layers configuring the wiring pattern are silver layer/silver nanoparticle paste layer/nickel layer/palladium layer in the order from the lower layer.

Then, the Au layer 120 is formed on the wiring pattern described above (see part (d) of FIG. 4). Therefore, it is possible to prevent oxidization of the silver wiring of the wiring pattern.

As in the embodiment, when an Ni/Au layer or an Ni/Pd/Au layer is formed on the layer of an Ag nanoparticle paste by an electroless plating process, an excellent plating property is obtained, compared to the case of the embodiment 1 where an Ni/Au layer or an Ni/Pd/Au layer is formed on the Ag resin paste by the electroless plating process. This depends on a catalyst imparting property of the Ag nanoparticle paste. In addition, it is desirable to use the Ag nanoparticle paste after using the Ag resin paste as the base of the Ag nanoparticle paste, compared to a case of using the Ag nanoparticle paste singly. This is because of the improvement of the adhesive strength.

Then, the plurality of light emitting elements 110 are fixed onto the ceramic insulating film 150 (high light reflection ceramic layer 150a) using resin paste. In addition, each light emitting element 110 is connected with a wire and the conductor wirings 160 and 165 and the light emitting elements 110 are wire-bonded for electric connection (see part (e) of FIG. 4).

Next, the light reflection resin frame 130 is formed on the substrate 100, the anode conductor wiring 160 and the cathode conductor wiring 165 so as to surround the periphery of the mounting area of the light emitting elements 110. A method for forming the light reflection resin frame 130 is not particularly limited, and a well-known method of the related art can be used.

After that, the area surrounded by the light reflection resin frame 130 is filled with the sealing resin 140 and the sealing resin seals the ceramic insulating film 150, the light emitting elements 110 and the wire, and the like in the area described above (see part (f) of FIG. 4).

Reflectivity of the ceramic insulating film 150 (high light reflection ceramic layer 150a) formed in the embodiment (reflectivity of light having a wavelength of 450 nm) is higher than the reflectivity of the aluminum substrate 100 by approximately 4%.

When the high light reflection ceramic layer 150a and the high thermal conductivity ceramic layer 150b have an excessively great thickness, cracks may be generated, and when the ceramic layers have an excessively small thickness, a sufficient light reflection property, thermal conductivity, and dielectric strength voltage may not be obtained. Accordingly, in the embodiment, the thickness of each layer is set to be 50 µm, in consideration of properties required for the high light reflection ceramic layer 150a and the high thermal conductivity ceramic layer 150b (high light reflection property, high thermal conductivity, and dielectric strength voltage) and prevention of generation of cracks. When it is desired to give priority to one of the properties of a high light reflection property and high thermal conductivity, the thickness of any one layer may be set to be thick. However, in order to prevent generation of cracks and to satisfy the properties required for the high light reflection ceramic layer 150a and the high thermal conductivity ceramic layer 150b, the thickness of each layer is preferably set to be from 10 µm to 65 µm and more preferably set to be from 25 µm to 50 µm. In order to more reliably prevent generation of cracks, a total value of the thickness of the high light reflection ceramic layer 150a and the high thermal conductivity ceramic layer 150b is preferably set to be from 100 µm to 130 µm.

Embodiment 3

Still another embodiment of the invention will be described. For convenience of description, the same reference numerals are used for the members having the same functions as those of the members described in the embodiment 1, and the description thereof will be omitted.

In the embodiment 2, the ceramic insulating film 150 having a multi-layered structure formed of the high thermal conductivity ceramic layer 150b and the high light reflection ceramic layer 150a was formed on the substrate 100. With respect to this, a light-emitting device according to the embodiment has a multi-layered structure including a silver (Ag) layer for applying a light reflection property and a high thermal conductivity ceramic layer on a substrate.

In the embodiment 1, the silver layer of the wiring pattern including the anode conductor wiring 160, the cathode conductor wiring 165, and the anode electrode 170 and the cathode electrode 180 as land portions was formed by silver resin paste printing and the nickel layer of the wiring pattern was formed on the silver layer. With respect to this, in the embodiment, a gold layer to be the base is formed as the wiring pattern by Au resin paste printing.

Figure 5:
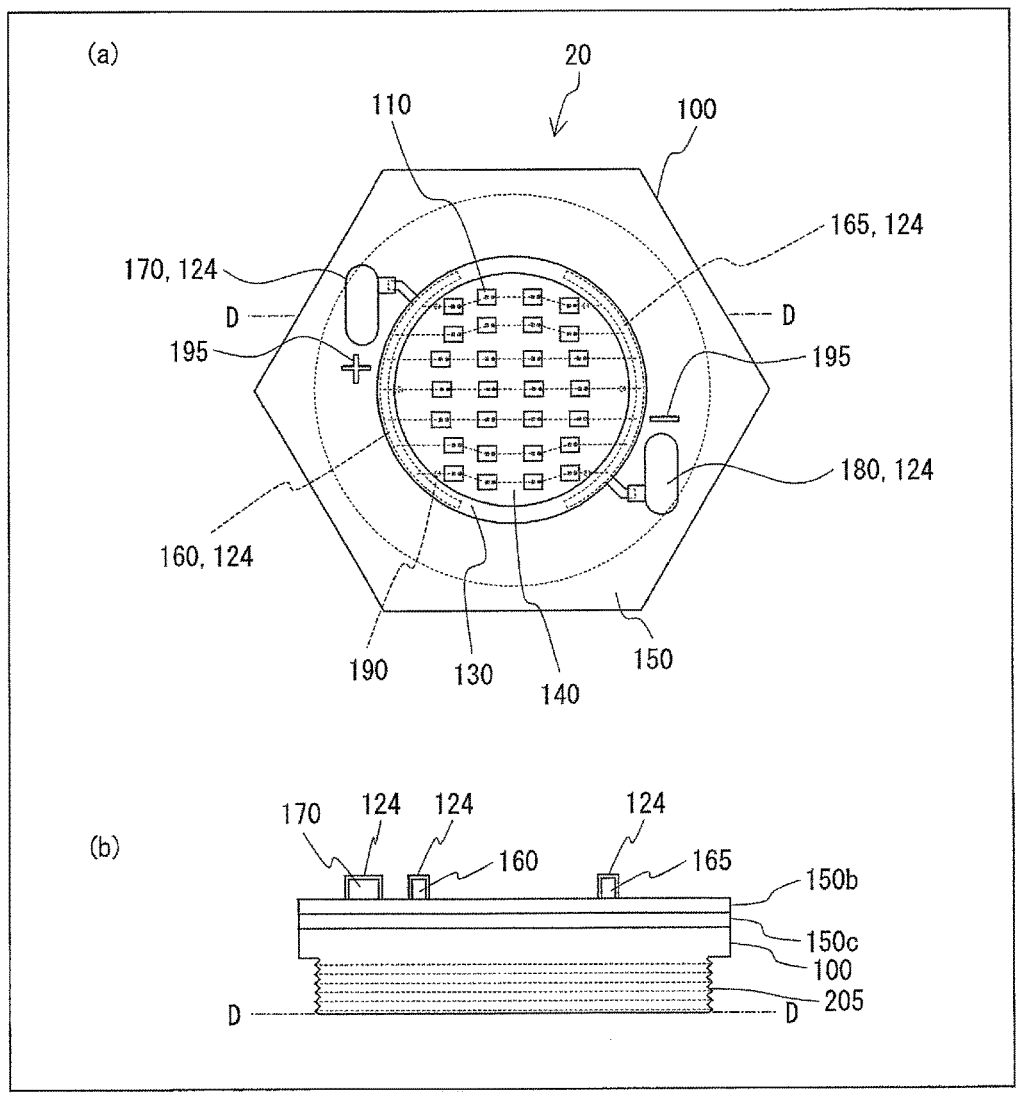
FIG. 5 includes a top view and a sectional view of a light-emitting device according to embodiment 3 of the invention.

Part (a) of FIG. 5 is a top view showing a configuration example of a light-emitting device 20 according to the embodiment and part (b) of FIG. 5 is a sectional view taken along D-D line shown in the part (a) of FIG. 5.

As shown in FIG. 5, the light-emitting device 20 includes the substrate 100, the light emitting elements (semiconductor light emitting elements) 110, the light reflection resin frame 130, the sealing resin 140, a silver (Ag) layer 150c, and the high thermal conductivity ceramic layer 150b.

The light-emitting device 20 is different from that of the embodiment 2 in that (i) the high thermal conductivity ceramic layer (high heat release ceramic layer) 150b (ceramic insulating film 150) is formed on the surface of the silver (Ag) layer 150c having a high reflection property, (ii) a male screw (screw member) 205 for fixing the light-emitting device 20 to a heat sink (not shown) is formed on the rear surface side of the substrate 100, (iii) the external shape of the substrate 100 is a hexagon, (iv) base metal is formed as the wiring pattern by the Au resin paste printing, and (v) a layer 124 of Au nanoparticle paste (gold nanoparticle paste) containing nano-sized gold (Au) particles is formed as a gold layer on the wiring pattern (base metal).

The multi-layered structure formed of the silver (Ag) layer 150c formed by plating on the substrate 100 and the high thermal conductivity ceramic layer 150b formed on the silver layer 150c by the printing method. In the embodiment, as the high thermal conductivity ceramic layer 150b, a ceramic material having electric insulation and a property of not absorbing light emitted from the light emitting elements 110 (optical transparency) is used.

By setting the configurations described above, it is possible to reflect the light leaked from the light emitting elements 110 in a substrate 100 direction by the silver layer 150c. In addition, it is possible to release the heat generated by the light emitting elements 110 from the high thermal conductivity ceramic layer 150b to the substrate 100 through the silver layer 150c. Accordingly, in the embodiment, it is possible to realize high thermal conductivity and high light reflection property by employing the multi-layered structure in which the silver layer 150c and the high thermal conductivity ceramic layer 150b are laminated.

The silver is known to extremely deteriorate in its reflectivity due to blackening, sulfuration, and discoloring, when the surface thereof is not coated, however, in the embodiment, it is possible to prevent deterioration in reflectivity of the silver layer 150c, since the surface of the silver layer 150c is coated with the high thermal conductivity ceramic layer 150b.

By setting the configuration of coating the wiring pattern with the layer 124 of the Au nanoparticle paste, it is possible to prevent deterioration of the wirings of the wiring pattern due to the oxidization.

In addition, the light-emitting device 20 includes the male screw 205 for attaching the light-emitting device 20 to a heat sink (not shown) on a part of the rear surface side of the substrate 100. Accordingly, it is possible to rigidly attach the light-emitting device 20 to a heat sink. The male screw 205 may be integrally formed with the substrate 100 or may be attached to the substrate 100 by welding or the like. A material of the male screw 205 is not particularly limited, but a material having high thermal conductivity is preferably used, in order to increase a heat release property to the heat sink.

In the light-emitting device 20, the external shape of the substrate 100 is a hexagon. Accordingly, it is possible to rigidly attach the light-emitting device 20 to the heat sink by the male screw 205, by fastening the substrate 100 using a tool such as a wrench or spanner. The external shape of the substrate 100 is not limited to the hexagon, and other polygons such as a triangle, a square, a pentagon, or an octagon may be used, a circle or an ellipse may be used or other shapes may be used. However, it is preferable that at least a part of the external shape of the substrate 100 is linear shape, in order to easily attach the light-emitting device 20 to the heat sink using the male screw 205.

In the embodiment, the configuration of including the silver layer 150c as a light reflection layer has been described, but there is no limitation thereto, and a metal layer having a light reflection property other than silver may be provided as a light reflection layer.

A method for manufacturing the light-emitting device 20 is not specifically described, but as one of different points from the method for manufacturing the light-emitting device 10, the method for manufacturing the light-emitting device 20 includes a step of forming the gold nanoparticle paste layer on the wiring pattern, instead of the step of the embodiment 2 of forming the gold layer on the wiring pattern by electroless plating.

Embodiment 4

In the embodiment 3, the base gold layer is formed as the wiring pattern by the Au resin paste printing, but in the embodiment, a base nickel layer is formed as the wiring pattern, instead of the base gold layer. As a method for forming the base nickel layer, nickel resin paste printing is used. In this case, it is possible to reduce the cost of materials, compared to a case of performing the Au resin paste printing. The configuration of the light-emitting device according to the embodiment is substantially the same configuration as that of the light-emitting device 20 according to the embodiment 3, except for forming the base nickel layer as the wiring pattern by the Ni resin paste printing.

In the embodiment, the wiring pattern is formed by forming the nickel layer on the substrate 100 (surface of the ceramic insulating film 150), but the wiring pattern may be formed by forming a nickel layer on the substrate 100 and forming a palladium layer on the nickel layer. In addition, the wiring pattern is formed by forming a primer on the substrate 100 and then substituting the primer with nickel. Regarding the formation of the primer, the pattern of the primer may be formed by ink jet or flexographic printing. Regarding the formation of the nickel, the formation of nickel from the primer may be promoted by causing action of a catalyst (for example, palladium catalyst) with respect to the primer.

Appendix 1

The ceramic insulating film of the embodiments 1 to 3 is desirably a zirconia-based ceramic. According to the configuration described above, when a metal material having a comparatively high melting point (temperature at least higher than a sintering temperature of the zirconia-based ceramic) as aluminum, for example, is set as a material of the metal substrate, an effect of sintering the ceramic on the metal substrate surface while maintaining the shape of the metal substrate, by using the zirconia-based ceramic to be sintered at a sintering temperature which is lower than the melting point of the metal material. As in the embodiments 1 to 3, the ceramic insulating film desirably has thermal conductivity and a light reflection property, but may not have thermal conductivity and a light reflection property.

The ceramic on the metal plate may be ceramic which does not need the sintering. In this case, the step of sintering can be omitted and a desired electronic circuit board can be obtained at a low cost. In addition, a step of surface treatment of roughening the ceramic surface by emitting inert gas such as argon may be added, before forming the wiring onto ceramic. Therefore, it is possible to improve adhesiveness of the wiring to ceramic and to obtain an electronic circuit board having high reliability.

Appendix 2

A plating primer process may be performed on the surface of the ceramic insulating film. In this case, the Au layer 120 may be formed on the wiring pattern by performing Ni plating and Au plating on the surface (plating primer layer) of the ceramic insulating film after the plating primer process. In the same manner as described above, a Ni/Pd/Au layer may be formed on the ceramic insulating film by performing Ni plating, Pd plating, and then Au plating on the surface (plating primer layer) of the ceramic insulating film after the plating primer process. The Ni layer, the Pd layer, and the Au layer on the plating primer layer may be formed using electroless plating. The plating primer layer may include palladium as a plating catalyst primer. The pattern of the plating primer layer may be formed by ink jet or flexographic printing.

As an advantage in a case of performing the plating primer process, it is possible to simplify the manufacturing step, compared to a case of performing the Au resin paste printing.

Appendix 3

As described in the embodiments 1 to 3, the circuit board includes the metal plate, the ceramic insulating film, the wiring pattern, and the gold layer which is formed on the wiring pattern. Since the circuit board includes the metal plate, it has an excellent heat release property. Accordingly, it is possible to efficiently release the heat generated by the light emitting elements and to contribute to long life of the light emitting elements. When an element which generate heat such as a power semiconductor, is mounted on this circuit board having a high heat release property, for example, the same effects can be obtained.

Appendix 4

The ceramic insulating film 150 may be formed by baking and hardening ceramic by a glass binder. Alternatively, the ceramic insulating film 150 may be formed by baking and hardening ceramic by a binder which is formed with a material other than glass.

CONCLUSION

As described above, the light-emitting device according to the first aspect of the invention (light-emitting devices 10, 20, and 30) includes the substrate (substrate 100) and the light emitting elements (light emitting elements 110) disposed on the substrate, in which the wiring pattern electrically connected to the light emitting elements is formed on the substrate, and the gold layer (Au layer 120, Au nanoparticle paste layer 124) is formed on the wiring pattern.

According to the configuration described above, the wiring pattern of the light-emitting device is covered with the gold layer. Accordingly, the light-emitting device exhibits an effect that the deterioration of the wiring due to the oxidization hardly occurs.

In the first aspect, in the light-emitting device (light-emitting device 30) according to the second aspect of the invention, it is desirable that the wiring pattern includes the silver layer formed on the substrate and the nickel layer formed on the silver layer.

In the second aspect, in the light-emitting device according to the third aspect of the invention, it is desirable that the wiring pattern further includes a palladium layer formed between the nickel layer and the gold layer.

In the second or third aspect, in the light-emitting device according to the fourth aspect of the invention, it is desirable that the wiring pattern further includes a silver nanoparticle paste layer formed between the silver layer and the nickel layer.

In the first aspect, in the light-emitting device according to the fifth aspect of the invention, it is desirable that the gold layer is formed by a gold nanoparticle paste layer (layer 124).

In the fifth aspect, in the light-emitting device according to the sixth aspect of the invention, it is desirable that the wiring pattern includes a base gold layer.

In the fifth aspect, in the light-emitting device according to the seventh aspect of the invention, it is desirable that the wiring pattern includes a base nickel layer.

In any one aspect of the first to seventh aspects, in the light-emitting device according to the eighth aspect of the invention, it is desirable that the substrate includes a metal plate, and a ceramic insulating film formed on the metal plate.

In the eighth aspect, in the light-emitting device according to the ninth aspect of the invention, it is desirable that the metal plate is configured with an aluminum material.

According to the configurations described above, in the light-emitting device, the thermal conductivity of the metal substrate can be set as 230 [W/m·k]. In addition, regarding aluminum, the cost is low, the processing is easily performed, and aluminum has high resistance in atmosphere humidity, it is possible to reduce the manufacturing cost of the electronic apparatus. When aluminum having a low melting point is used as the metal substrate, it is possible to maintain the shape of the metal substrate and to sinter a ceramic to the surface of the metal substrate, by using a zirconia-based ceramic which is sintered at a sintering temperature which is lower than the melting point of aluminum, as a material of the insulating layer.

In the eighth aspect, in the light-emitting device according to the tenth aspect of the invention, it is desirable that the metal plate is configured with a copper material.

According to the configuration described above, in the light-emitting device, the thermal conductivity of the metal substrate may be set as 398 [W/m·k].

In the eighth aspect, in the light-emitting device according to the eleventh aspect of the invention, it is desirable that the ceramic insulating film has thermal conductivity and a light reflection property.

According to the configuration described above, it is possible to realize a light-emitting device in which an insulating layer having excellent thermal conductivity and light reflection property is formed on a substrate where light emitting elements are mounted. In addition, in order to obtain a large-output light-emitting device, it is necessary to mount a large number of light emitting elements on the substrate and to increase the area of the substrate, but according to the configuration described above, it is possible to easily realize a light-emitting device having high reflectivity and a high heat release property, by forming the ceramic insulating film on the large area substrate. According to the configuration described above, it is possible to release the heat generated by the light emitting elements to the substrate through the insulating layer. Therefore, it is possible to realize high thermal conductivity. In addition, it is possible to reflect, by the insulating layer, light leaked from the light emitting elements in the substrate surface direction. Therefore, it is possible to realize high thermal conductivity and a high light reflecting property. As a material of the insulating layer described above, a zirconia-based ceramic that is described later can be exemplified.

In the eighth aspect, in the light-emitting device according to the twelfth aspect of the invention, it is desirable that the ceramic insulating film is a zirconia-based ceramic. According to the configuration described above, when a metal material having a comparatively high melting point (temperature at least higher than a sintering temperature of the zirconia-based ceramic) as aluminum, for example, is set as a material of the metal substrate, an effect of sintering the ceramic on the metal substrate surface while maintaining the shape of the metal substrate, by using the zirconia-based ceramic to be sintered at a sintering temperature which is lower than the melting point of the metal material.

In any one aspect of the first to twelfth aspects, in the light-emitting device according to the thirteenth aspect of the invention, it is desirable that the wiring pattern includes a conductor wiring and a land portion for anode and a conductor wiring and a land portion for cathode.

A method for manufacturing a light-emitting device according to a fourteenth aspect of the invention includes a step of forming a wiring pattern on a ceramic substrate, and a step of forming a gold layer on the wiring pattern.

According to the configuration described above, the manufacturing method exhibits the same effects as those of the light-emitting device according to the first aspect of the invention.

In the fourteenth aspect, in the method for manufacturing a light-emitting device according to a fifteenth aspect of the invention, it is desirable that the step of forming the gold layer includes a step of forming a gold nanoparticle paste layer.

In the fourteenth aspect, in the method for manufacturing a light-emitting device according to a sixteenth aspect of the invention, it is desirable that the step of forming the wiring pattern includes a step of forming a nickel layer.

In the sixteenth aspect, in the method for manufacturing a light-emitting device according to a seventeenth aspect of the invention, it is desirable that the step of forming the wiring pattern further includes a step of forming a palladium layer on the nickel layer.

In the sixteenth or seventeenth aspect, in the method for manufacturing a light-emitting device according to an eighteenth aspect of the invention, it is desirable that the step of forming the nickel layer includes a step of forming a primer on the ceramic substrate and a step of forming a nickel layer on the primer.

According to the configurations described above, the manufacturing method further exhibits an effect of manufacturing the light-emitting device without using paste.

The invention is not limited to the embodiments described above. Various modifications may be performed within the scope of claims, and the embodiments realized in suitable combination of technical means disclosed in different embodiments are also included in the technical scope.

INDUSTRIAL APPLICABILITY

The present invention may be used in a light-emitting device including light emitting elements formed on a substrate.

REFERENCE SIGNS LIST 10, 20, 30 LIGHT-EMITTING DEVICE
100 SUBSTRATE
110 LIGHT EMITTING ELEMENT
120 Au LAYER
122 Ag NANOPARTICLE PASTE LAYER
123 NICKEL LAYER
124 Au NANOPARTICLE PASTE LAYER
130 LIGHT REFLECTION RESIN FRAME
140 SEALING RESIN
150 CERAMIC INSULATING FILM
150a HIGH LIGHT REFLECTION CERAMIC LAYER (SECOND CERAMIC LAYER)
150b HIGH THERMAL CONDUCTIVITY CERAMIC LAYER (FIRST CERAMIC LAYER)
150c SILVER LAYER (METAL LAYER)
160 ANODE CONDUCTOR WIRING (WIRING)
165 CATHODE CONDUCTOR WIRING (WIRING)
170 ANODE ELECTRODE (ELECTRODE PORTION)
180 CATHODE ELECTRODE (ELECTRODE PORTION)
205 MALE SCREW (SCREW PORTION)

The invention claimed is:

1. A light-emitting device comprising:
a metal plate substrate;
a ceramic insulating film on the substrate;
light emitting elements on the substrate;
a wiring pattern electrically connected to the light emitting elements on the substrate; and
a gold layer on the wiring pattern, wherein
the wiring pattern includes a printed silver resin paste layer on the substrate, an electroless plated nickel layer on the printed silver resin paste layer, and a silver nanoparticle paste layer between the silver resin paste layer and the nickel layer.

2. The light-emitting device according to claim 1, wherein the wiring pattern further includes a palladium layer between the nickel layer and the gold layer.

3. The light-emitting device according to claim 1, wherein the gold layer includes a gold nanoparticle paste layer.

4. The light-emitting device according to claim 3, wherein the wiring pattern further includes a base of the gold layer.

5. The light-emitting device according to claim 3, wherein the wiring pattern further includes a base nickel layer.

6. The light-emitting device according to claim 1, wherein the metal plate includes an aluminum material.

7. The light-emitting device according to claim 1, wherein the metal plate includes a copper material.

8. The light-emitting device according to claim 1, wherein the ceramic insulating film has thermal conductivity and a light reflection property.

9. The light-emitting device according to claim 1, wherein the ceramic insulating film is a zirconia-based ceramic.

10. The light-emitting device according to claim 1, wherein the wiring pattern further includes a conductor wiring and a land portion for an anode and a conductor wiring and a land portion for a cathode.

* * * * *